United States Patent
Kwasny (10) Patent No.: US 7,645,177 B2
(45) Date of Patent: Jan. 12, 2010

(54) ELECTROLUMINESCENT PANEL WITH INKJET-PRINTED ELECTRODE REGIONS

(75) Inventor: David M. Kwasny, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 603 days.

(21) Appl. No.: 11/124,249

(22) Filed: May 7, 2005

(65) Prior Publication Data

US 2006/0250081 A1    Nov. 9, 2006

(51) Int. Cl.
*H01J 9/24* (2006.01)
*H01J 1/62* (2006.01)

(52) U.S. Cl. .......................... 445/24; 313/509; 445/49

(58) Field of Classification Search ................ 445/24, 445/49; 313/309
See application file for complete search history.

(56) References Cited

U.S. PATENT DOCUMENTS

| | | | |
|---|---|---|---|
| 5,808,412 A * | 9/1998 | Zovko et al. ............... 313/509 |
| 6,203,391 B1 | 3/2001 | Murasko |
| 6,372,154 B1 | 4/2002 | Li |
| 6,388,377 B1 | 5/2002 | Kobayashi et al. |
| 6,424,088 B1 | 7/2002 | Murasko |
| 6,498,049 B1 | 12/2002 | Friend et al. |
| 6,566,808 B1 | 5/2003 | Duggal et al. |
| 6,844,673 B1 * | 1/2005 | Bernkopf .................... 445/24 |
| 7,425,795 B2 * | 9/2008 | Anderson et al. .......... 313/509 |
| 2001/0035716 A1 | 11/2001 | Murasko |
| 2001/0042329 A1 | 11/2001 | Murasko et al. |
| 2002/0060518 A1 | 5/2002 | Duineveld et al. |
| 2002/0079832 A1 | 6/2002 | Van Tongeren et al. |
| 2002/0079833 A1 | 6/2002 | Kobayashi et al. |
| 2002/0090495 A1 | 7/2002 | Bezenek et al. |
| 2002/0142188 A1 * | 10/2002 | Andriash ................... 428/690 |
| 2002/0155214 A1 | 10/2002 | Murasko |
| 2002/0157173 A1 | 10/2002 | Murasko et al. |
| 2002/0163300 A1 | 11/2002 | Duineveld et al. |
| 2002/0164415 A1 | 11/2002 | Van Der Schaft et al. |
| 2003/0032361 A1 | 2/2003 | Murasko et al. |
| 2003/0119414 A1 | 6/2003 | Wei |
| 2003/0141810 A1 | 7/2003 | Kobayashi et al. |
| 2003/0222574 A1 * | 12/2003 | Morley et al. .............. 313/504 |
| 2003/0227509 A1 | 12/2003 | Usuda |
| 2004/0058615 A1 | 3/2004 | Murasko et al. |
| 2004/0086631 A1 | 5/2004 | Han et al. |
| 2004/0119066 A1 | 6/2004 | Han et al. |
| 2004/0158975 A1 | 8/2004 | Kawaguchi et al. |
| 2004/0178414 A1 | 9/2004 | Frey et al. |

FOREIGN PATENT DOCUMENTS

| | | |
|---|---|---|
| JP | 2000-208279 | 7/2000 |
| WO | WO01/10571 | 2/2001 |
| WO | WO01/80272 | 10/2001 |

OTHER PUBLICATIONS

Alan Hudd, The role of inkjet in the future of printed electronics, www.xennia.com, copyright 2004.
Transmittal of the International Search Report and the Written Opinion of the International Searching Authority dated Mar. 1, 2007.

* cited by examiner

*Primary Examiner*—Peter Macchiarolo

(57) ABSTRACT

An electroluminescent panel includes a partial electroluminescent panel base and one or more electrode regions. The electrode regions are inkjet-printed on the partial electroluminescent base.

23 Claims, 6 Drawing Sheets

FIG. 7

ELECTROLUMINESCENT PANEL WITH INKJET-PRINTED ELECTRODE REGIONS

BACKGROUND

An electroluminescent (EL) panel includes a layer of electroluminescent phosphor powder and a dielectric sandwiched between front and rear electrodes. At least one of these electrodes is transparent. On application of a voltage, the electroluminescent phosphor emits light. One of the electrodes, usually the rear electrode, may be divided into a number of different regions, so that corresponding regions of the EL panel can be selectively and independently lit. Typically, creating the different regions of the rear electrode is accomplished by a screen-printing process. However, the screen-printing process is cost effective only for large production runs. That is, where just a small number of EL panels are desired to be made with particular independently and selectively lit regions, the screen-printing process can be cost prohibitive.

BRIEF DESCRIPTION OF THE DRAWINGS

The drawings referenced herein form a part of the specification. Features shown in the drawing are meant as illustrative of only some embodiments of the invention, and not of all embodiments of the invention.

DETAILED DESCRIPTION OF THE DRAWINGS

In the following detailed description of exemplary embodiments of the invention, reference is made to the accompanying drawings that form a part thereof, and in which is shown by way of illustration specific exemplary embodiments in which the invention may be practiced. These embodiments are described in sufficient detail to enable those skilled in the art to practice the invention. Other embodiments may be utilized, and logical, mechanical, electrical, electro-optical, software/firmware and other changes may be made without departing from the spirit or scope of the present invention. The following detailed description is, therefore, not to be taken in a limiting sense, and the scope of the present invention is defined only by the appended claims.

Figure 1A:
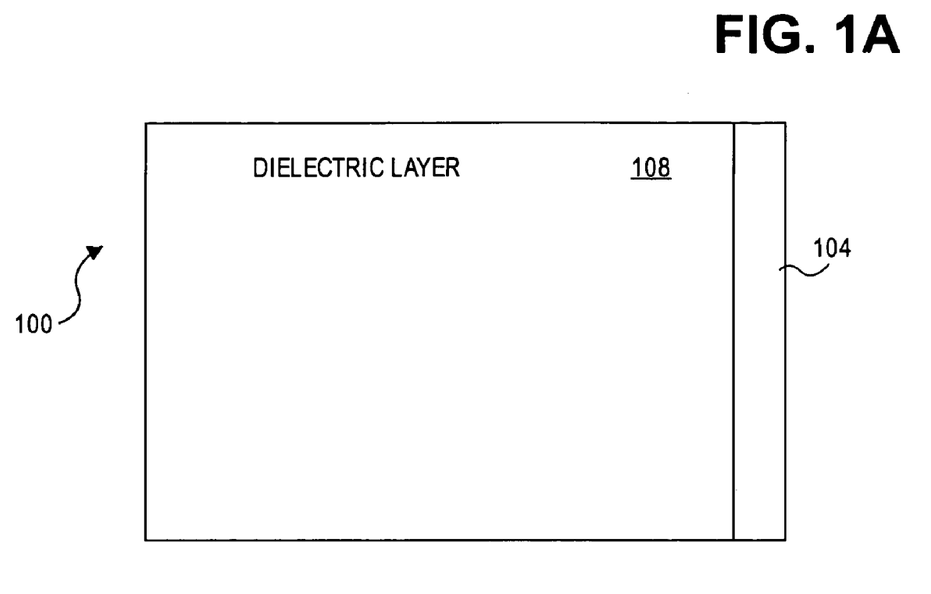
FIGS. 1A and 1B are diagrams of a partial electroluminescent (EL) panel, according to an embodiment of the invention.
Figure 1B:
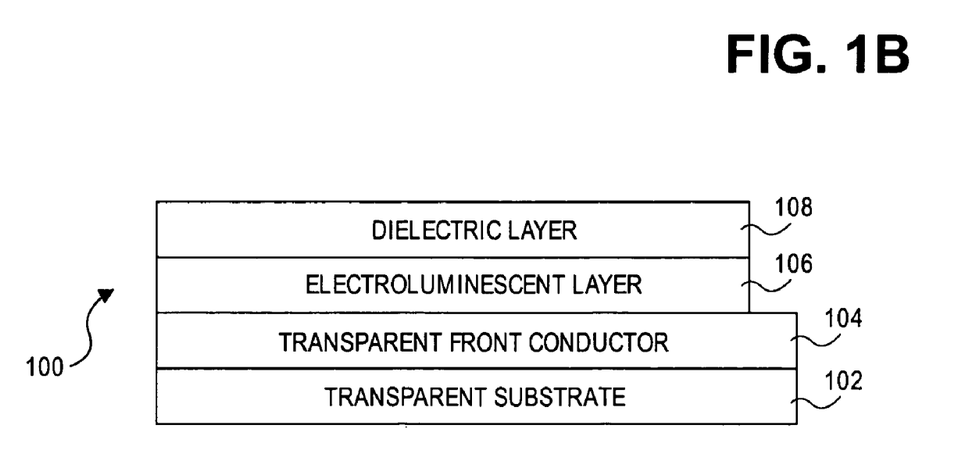

FIGS. 1A and 1B show a partial electroluminescent (EL) panel 100, according to an embodiment of the invention. FIG. 1A specifically shows a top view of the partial EL panel 100, whereas FIG. 1B specifically shows a cross-sectional side view of the partial EL panel 100. The partial EL panel 100 may also be referred to as a partial EL panel base. The partial EL panel 100 is the basis upon which a complete and operable EL panel is fabricated, according to embodiments of the invention, as is described later in the detailed description. The partial EL panel 100 may specifically be manufactured in large runs, or in bulk, and delivered to outfits or entities that then fabricate smaller runs of complete EL panels using such partial EL panels.

The partial EL panel 100 includes a transparent substrate 102, a transparent front conductor 104 situated next to or over the transparent substrate 102, an electroluminescent layer 106 situated next to or over the transparent front conductor, or electrode, 104, and a dielectric layer 108 situated next to or over the dielectric layer 108. The partial EL panel 100 is depicted in FIG. 1B upside-down to indicate how the various layers and components of the partial EL panel 100 are typically fabricated. In actual use, the transparent substrate 102 is oriented so that it is positioned towards the front, or top, so that light from the electroluminescent layer 106 can emit therethrough, and the dielectric layer 108 is positioned towards the back, or bottom.

The transparent substrate 102 may be polyethylene terephthalate (PET), another type of clear plastic, or another type of transparent substrate material. The substrate 102 is transparent in the sense that it is at least partially or substantially transparent, and/or at least partially or substantially allows light to transmit therethrough. The transparent front conductor, or electrode, 104 may be indium tin oxide (ITO), antimony tin oxide (ATO), or another type of transparent conductive material. The conductor 104 is transparent in the sense that it is at least partially or substantially transparent, and/or at least partially or substantially allows light to transmit therethrough. The conductor 104 is a front conductor because in actual use, the conductor 104 is oriented so that it is positioned towards the front, or top, so that light from the electroluminescent layer 106 can emit therethrough, and a rear conductor, or electrode, that is fashioned over the dielectric layer 108 is positioned towards the back, or bottom. The rear electrode is specifically not part of the partial EL panel 100, and is typically fabricated at a different point in time as compared to the partial EL panel 100.

For instance, as has been described, the partial EL panel 100 may be manufactured in large runs, or in bulk, such that complete EL panels are fabricated from such partial EL panels in smaller runs. Such complete EL panels may be fabricated by forming the rear electrode onto an existing, manufactured-in-bulk partial EL panel, like the partial EL panel 100, as is described in more detail later in the detailed description. That is, smaller runs of complete EL panels are manufactured by fabricating the rear electrode in a desired manner on top of preexisting partial EL panels, like the partial EL panel 100.

The electroluminescent layer 106 may be an inorganic or organic phosphor. The dielectric layer 108 may be barium titanate powder in a polyurethane binder, or another type of dielectric. The dielectric layer 108, together with the electroluminescent layer 106, the transparent front conductor 104, and a rear conductor that is fashioned over the dielectric layer 108, but which is not specifically part of the partial EL panel 100, forms a capacitor. Application of a voltage over the dielectric layer 108 energizes the electroluminescent layer 106, which causes light to be emitted from the electroluminescent layer 106. The electroluminescent layer 106 extends from edge to edge over the transparent front conductor 104, except that a portion of the transparent front conductor 104 does not have the electroluminescent layer 106 formed thereover, so that this portion of the front conductor 104 is accessible. That is, the electroluminescent layer 106 is not patterned.

Figure 2A:
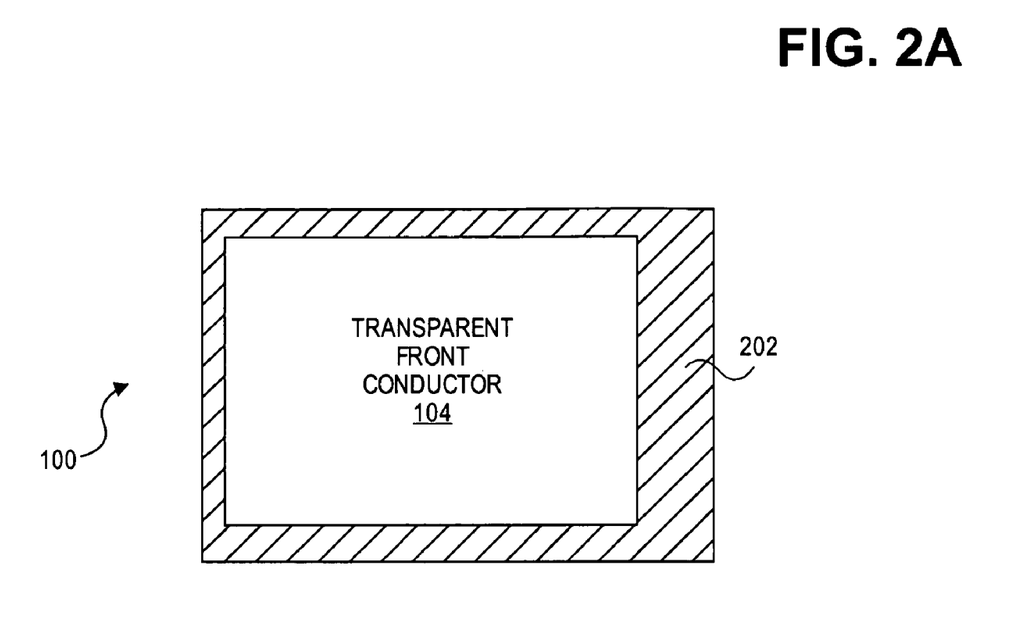
FIGS. 2A and 2B are diagrams of a partial EL panel, according to another embodiment of the invention.
Figure 2B:
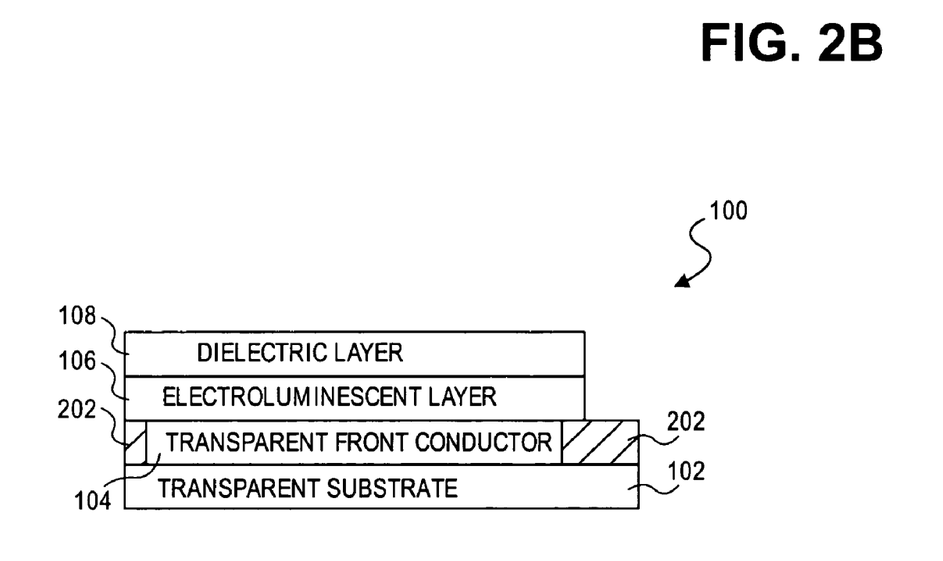

FIGS. 2A and 2B show the partial EL panel 100, according to another embodiment of the invention. FIG. 2A specifically shows a cross-sectional top view of the partial EL panel 100, not including the dielectric layer 108 and the electroluminescent layer 106, whereas FIG. 2B specifically shows a cross-sectional side view of the partial EL panel 100. As in the embodiment of FIGS. 1A and 1B, the partial EL panel 100 of FIGS. 2A and 2B includes a transparent substrate 102, a transparent front conductor 104 over the substrate 102, an electroluminescent layer 106 over the conductor 104, and a dielectric layer 108 over the electroluminescent layer 106.

However, the partial EL panel 100 of FIGS. 2A and 2B also includes a front busbar 202 circumnavigating the transparent front conductor 104 on the transparent substrate 102. The front conductor 104 may be a weak conductor, such that electricity applied to one part of the front conductor 104 may not uniformly extend to all parts of the front conductor 104. The net result, especially where the partial EL panel 100 is large, is that an EL panel formed using the partial EL panel 100 may not emit light uniformly.

The front busbar 202 therefore is fabricated from a relatively good conductive material, such as a metal like copper, silver, or aluminum, which extends around the transparent front conductor 104. The front busbar 202 may be constructed by applying a conductive ink, such as a silver paste, a carbon paste, or a combination of a silver paste and a carbon paste. The front busbar 202 may alternatively be constructed by applying a film, a layer, or the like. Electricity applied to the front busbar 202 thus allows for the electricity to more uniformly extend to all parts of the transparent front conductor 104. Put another way, the front busbar 202 is intended to ensure that electricity is able to flow to all parts of the transparent front conductor in at least a substantially uniform manner. The presence of the front busbar 202 is optional, but can be desirable especially where the partial EL panel 100 is relatively large. The front busbar 202 is electrically connected to the transparent front conductor 104 due to direct contact with the transparent front conductor 104, and is not electrically isolated from the transparent front conductor 104.

A portion of the front busbar 202 is revealed even after the dielectric layer 108 and the electroluminescent layer 106 have been formed on top of the transparent front conductor 104 and the transparent substrate 102. This is so that an electrical connect can be attached easily to a portion of the front busbar 202, so that the front busbar 202 can be connected to an electrical driver to provide electricity to the front busbar 202. Without exposure of a portion of the front busbar 202 even after the dielectric layer 108 and the electroluminescent layer 106 have been formed over the transparent front conductor 104 and the transparent substrate 102, attachment of an electrical connect to the front busbar 202 may otherwise require removal of a portion of the dielectric layer 108 and the electroluminescent layer 106.

Figure 3A:
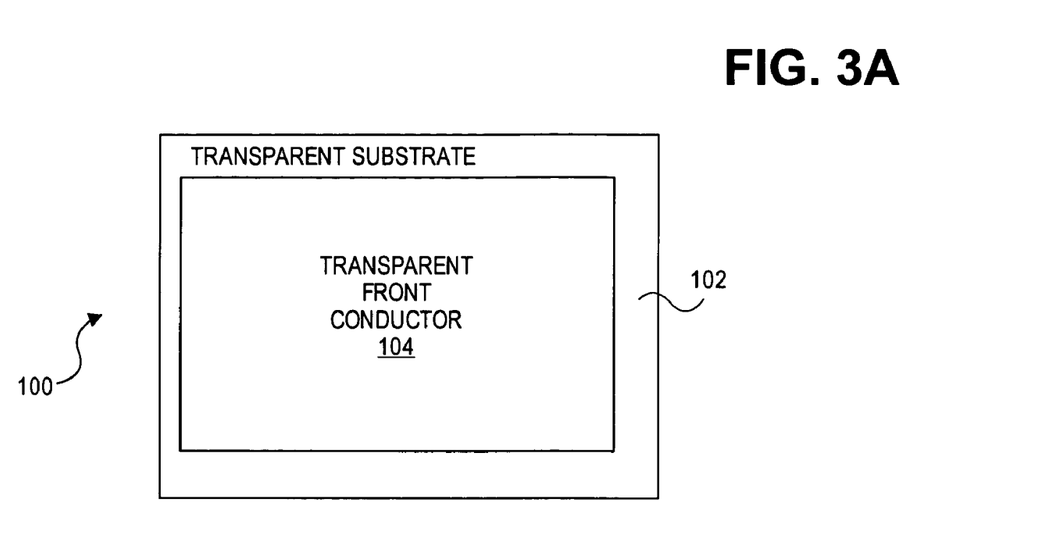
FIGS. 3A and 3B are diagrams of a partial EL panel, according to another embodiment of the invention.
Figure 3B:
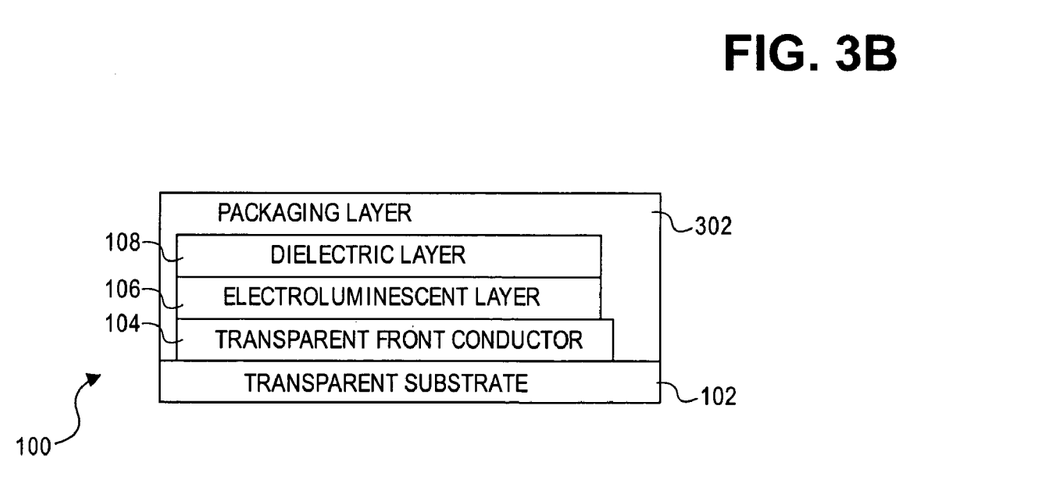

FIGS. 3A and 3B show the partial EL panel 100, according to another embodiment of the invention. FIG. 3A specifically shows a cross-sectional top view of the partial EL panel 100, not including the dielectric layer 108 and the electroluminescent layer 106, whereas FIG. 3B specifically shows a cross-sectional side view of the partial EL panel 100. As in the embodiment of FIGS. 1A and 1B and in the embodiment of FIGS. 2A and 2B, the partial EL panel of FIGS. 3A and 3B includes a transparent substrate 102, a transparent front conductor 104 over the substrate 102, an electroluminescent layer 106 over the conductor 104, and a dielectric layer 108 over the electroluminescent layer 106, with the a portion of the transparent front conductor 104 not covered by the electroluminescent layer 106 and the dielectric layer 108.

There are two differences between the embodiment of FIGS. 3A and 3B and the embodiments of FIGS. 1A and 1B and of FIGS. 2A and 2B. First, the transparent front conductor 104, the electroluminescent layer 106, and the dielectric layer 108 are fabricated on the transparent substrate 102 such that the conductor 104, the layer 106, and the layer 108 do not completely cover the substrate 102. This allows a front busbar, like the front busbar 202 of FIGS. 2A and 2B, to be fabricated on the transparent substrate 102 of the partial EL panel 100, even after the conductor 104, the layer 106, and the layer 108 have been fabricated on the substrate 102. It is noted that whereas the busbar 202 is depicted in FIGS. 2A and 2B as abutting the front conductor 104. However, in actuality, the busbar 202 is likely to slightly overlap the front conductor 104.

Thus, where the partial EL panel 100 is specifically manufactured in large runs, or in bulk, such that complete EL panels are fabricated from such partial EL panels by fabricating rear electrodes in smaller runs on preexisting partial EL panels, a front busbar may also be fabricated on such partial EL panels as part of the complete EL panels. That is, the same process that is used to fabricate rear electrodes on preexisting partial EL panels may be used to manufacture front busbars within the exposed regions of the transparent substrates of such partial EL panels. Such an embodiment may be desirable where front busbars are fabricated just when necessary, and not always needed.

The second difference between the embodiment of FIGS. 3A and 3B and the embodiments of FIGS. 1A and 1B and of FIGS. 2A and 2B is the presence of a packaging layer 302 over the dielectric layer 108. The packaging layer 302 may also be included over the dielectric layer 108 of the partial EL panel 100 of FIGS. 1A and 1B and/or of the partial EL panel 100 of FIGS. 2A and 2B, in one embodiment. The packaging layer 302 is a temporary layer applied to the partial EL panel 100 to protect the partial EL panel 100 during shipment or storage, and then is subsequently removed when the partial EL panel 100 is used to fabricate a complete EL panel. For instance, where the partial EL panel 100 is specifically manufactured in large runs, the partial EL panels may be fabricated at one location, and then shipped to a number of different locations at which complete EL panels are fabricated. To protect the partial EL panels, then, a packaging layer may be applied to each of them for protection during shipping and storage. Before the partial EL panel is used to make a complete EL panel, its packaging layer is thus removed. The packaging layer 302 may also be an air barrier layer to prevent air from undesirably chemically reacting with the dielectric layer 108 and the electroluminescent layer 106.

The packaging layer 302 is specifically depicted in FIG. 3B as extending over all of the layers 106 and 108, and the front conductor 104, to the front substrate 102. As a result, the packaging layer 302 protects the layers 106 and 108, and the front conductor 104. Furthermore, not depicted in FIG. 3B is that an additional packaging layer may be applied to the underside of the transparent substrate 102, so that the partial EL panel 100 is completely encapsulated. In another embodiment, a packaging-type envelope may be provided, within which the partial EL panel 100 is encapsulated.

Figure 4A:
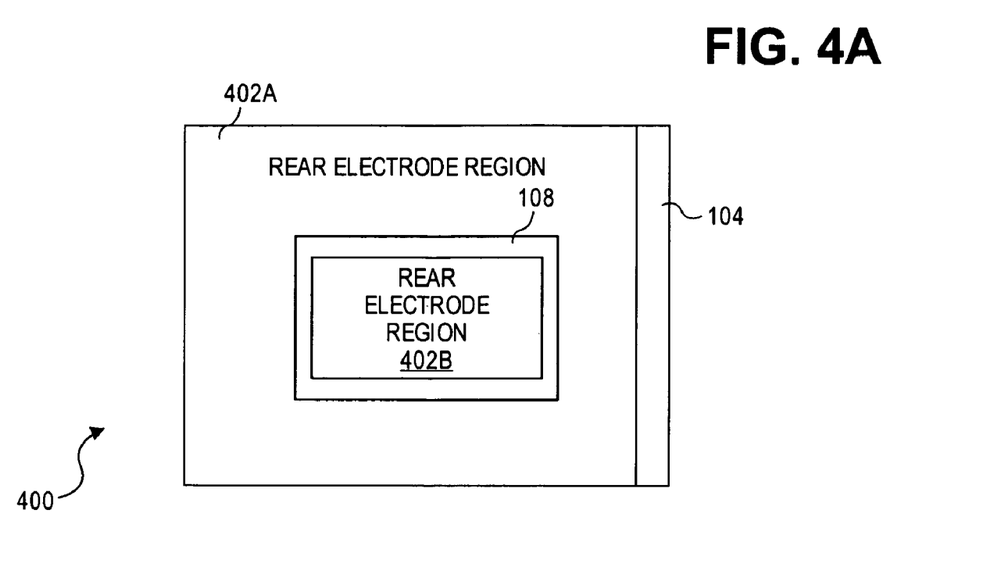
FIGS. 4A and 4B are diagrams of a complete EL panel, according to an embodiment of the invention.
Figure 4B:
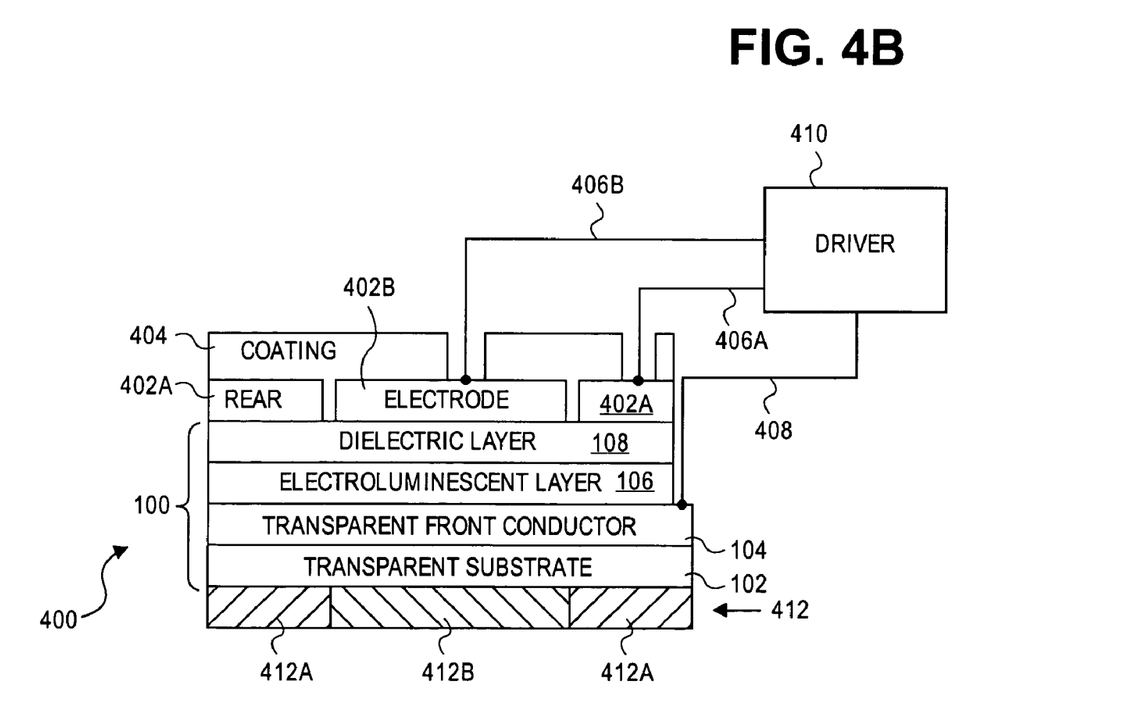

FIGS. 4A and 4B show a complete EL panel 400 fabricated using the partial EL panel 100, according to an embodiment of the invention. FIG. 4A specifically shows a cross-sectional top view of the complete EL panel 400, not including the coating 404, whereas FIG. 4B specifically shows a cross-sectional side view of the complete EL panel 400. The complete EL panel 400 depicted in FIGS. 4A and 4B specifically employs the partial EL panel 100 of FIGS. 1A and 1B. However, in other embodiments, the complete EL panel 400 depicted in FIGS. 4A and 4B can instead employ the partial EL panel of FIGS. 2A and 2B or of FIGS. 3A and 3B.

On top of the dielectric layer 108 of the partial EL panel 100, rear electrode, or conductor, regions 402A and 402B, collectively referred to as the rear electrode regions 402, are inkjet printed using conductive ink. It is noted that if the partial EL panel 100 being used includes a packaging layer 302, then the layer 302 is first removed prior to inkjet-printing the rear electrode regions 402 on top of the dielectric layer 108 using the conductive ink. The rear electrode regions 402 are electrically isolated from one another, such that there are small gaps between adjacent rear electrode regions, as depicted in FIGS. 4A and 4B. The size of the gap is determined by the pattern of the separate regions 402. Where the regions 402 are adjacent to one another, the gap therebetween is small, but sufficient to provide electrical isolation.

It is noted that the terminology "inkjet printing using conductive ink" encompasses such inkjet printing where more than one conductive ink is employed. Furthermore, the terminology "conductive ink" encompasses ink that is not immediately conductive upon inkjet printing, but becomes conductive after further actions are performed. For instance, some inks become conductive upon being thermally or otherwise cured. Therefore, inkjet printing using conductive ink encompasses performing whatever actions are needed to render the ink conductive. For example, a polymer-capped monomodal silver nano-particle ink is available from Cabot Corp. that is applied by inkjet-printing, and subsequently is subjected to a low-temperature sintering to remove the caps on the particles, which increases the surface contact of the particles and increases their conductivity to render the ink conductive.

Applying a voltage between the rear electrode region 402A and the transparent front conductor 104 energizes the capacitor formed by the region 402A, the front conductor 104, the electroluminescent layer 106, and the dielectric layer 108, such that substantially just the portion of the electroluminescent layer 106 correspondingly underneath the rear electrode region 402A emits light. Similarly, applying a voltage between the rear electrode region 402B and the transparent front conductor 104 energizes the capacitor formed by the region 402B, the front conductor 104, the electroluminescent layer 106, and the dielectric layer 108, such that substantially just the portion of the electroluminescent layer 106 correspondingly underneath the rear electrode region 402B emits light.

Therefore, the rear electrode regions 402 are defined in accordance with a number, and shape, of regions of complete EL panel 400 that are desired to be selectively and independently illuminated. In FIGS. 4A and 4B, there are two such rear electrode regions 402, that are simplistically shaped as concentric rectangles, for illustrative and descriptive convenience. However, because inkjet-printing is a robust manner by which to apply conductive ink to define the rear electrode regions 402, there can be any number of different rear electrode regions in any number of different shapes and sizes. Each of the rear electrode regions 402 formed corresponds to a region of the EL panel 400 as a whole that can be selectively and independently illuminated.

Because inkjet-printing is a process that can be performed with little cost, even small runs of complete EL panels can be fabricated by inkjet-printing conductive ink on preexisting and premanufactured partial EL panels to form the rear electrode regions of the complete EL panels. Thus, the parts of the complete EL panels that require large runs to be profitable are the partial EL panels that are manufactured in large runs cost effectively. However, customized complete EL panels can be fabricated in a cost-effective manner by inkjet-printing rear electrode regions on these preexisting partial EL panels, in runs potentially as small as one panel.

Once the rear electrode regions 402 have been inkjet printed on the dielectric layer 108, a protective coating 404 may be applied thereover to protect the rear electrode regions 402. The protective coating 404 may be a laminate coating affixed to the rear electrode regions 402 with an adhesive, such that the coating 404 may have an adhesive backing, or a separate adhesive may be applied to the rear electrode regions 402 first before affixing the protective coating 404 thereto. The protective coating 404 may also be a fluoropolymer film, such as the clear and/or transparent moisture barrier film sold by Honeywell International Inc. under the trade name Aclar, or any other suitable type of encapsulant.

The protective coating 404 may further be a clear lacquer or other type of liquid-protective coating, which is applied with a brush, roller, spray, via inkjet, and so on, and which subsequently dries or is cured. Additionally, the coating 404 may extend over the sides of the EL panel 400, such as over the sides of the rear electrode regions 402, the layers 106 and 108, and the front conductor 104, similar to the packaging layer 108 extends over the sides of the partial EL panel 100 in FIG. 3B. The protective coating 404 may be thus be applied so that it fully covers the rear electrode regions 402. Alternatively, the protective coating 404 may be applied so that access remains to each of the rear electrode regions 402. That is, the protective coating 404 may be applied so that a portion of each of the regions 402 is not covered by the coating 404.

If the protective coating 404 is applied so that it fully covers the rear electrode regions 404, holes are physically cut into or material chemically removed from the protective coating 404 over each of the rear electrode regions 402A and 402B, so that electrical connects 406A and 406B, collectively referred to as the electrical connects 406, can be connected. The holes may alternatively be drilled or abraded through the protective coating 404, or may be realized in a different way as well. The electrical connects 406 may be insulated conductors, such as wires. Another electrical connect 408 is similarly connected to the transparent front conductor 104. The holes that have been formed or created within the protective coating 404 may thereafter be sealed, to protect against moisture and/or contamination.

The electrical connects 406 may also function as internal busbars. That is, each of the electrode regions 402A and 402B may be connected to their corresponding electrical connects 406A and 406B in more than one location. By connecting an electrical connect to its corresponding region in more than one location, or by continuously connecting the electrical connect to its corresponding region, such via a flat wire, more uniform current flows throughout the region.

Furthermore, there may alternatively be a small portion of the transparent front conductor 104 that is not covered by the electroluminescent layer 106, the dielectric layer 108, and the rear electrode regions 402, such that connection of the electrical connect 408 to the conductor 104 can be accomplished by simply creating a hole through the coating 404 and connecting the conductor 104 to the electrical connect 408 therethrough. However, if the partial EL panel 100 being used includes a front busbar 202, then the electrical connect 408 is instead attached to the front busbar 202 rather than the transparent front conductor 104. In such an embodiment, the front busbar 202 thus indirectly connects the transparent front conductor 104 to the electrical connect 408, since the front busbar 202 and the transparent front conductor 104 are not electrically isolated from one another.

The electrical connects 406 and 408 are attached to a driver 410, which includes or is connected to a voltage source, such as a battery or a wall outlet. Driving a voltage by the driver 410 between the electrical connect 406A and the electrical connect 408 energizes the capacitor formed by the rear electrode region 402A, the dielectric layer 108, the electroluminescent layer 106, and the transparent front conductor 104. As a result, the region of the electroluminescent layer 106 correspondingly underneath the rear electrode region 402A emits light, such that it can be said that a corresponding region of the complete EL panel 400 is illuminated. Similarly, driving a voltage by the driver 410 between the electrical connect 406B and the electrical connect 408 energizes the capacitor formed by the rear electrode region 402B, the dielectric layer 108, the electroluminescent layer 106, and the transparent front conductor 104. As a result, the region of the electroluminescent layer 106 correspondingly underneath the rear electrode region 402B emits light, such that it can be said that a corresponding region of the complete EL panel 400 is illuminated.

Driving a voltage between the electrical connect 406A and the electrical connect 408 is independent of driving a voltage between the electrical connect 406B and the electrical connect 408. Therefore, either a voltage may be driven between the connects 406A and 408, between the connects 406B and 408, or between both the connects 406A and 406B and the connect 408. Thus, either a region of the complete EL panel 400 corresponding to the rear electrode region 402A can be illuminated, a region of the complete EL panel 400 corresponding to the rear electrode region 402B can be illuminated, or regions of the complete EL panel 400 corresponding to both the rear electrode regions 402A and 402B can be illuminated.

As a final matter, an overlay 412, having overlay regions 412A and 412B, may be applied to the transparent substrate 102. The overlay regions 412A and 412B can correspond to the rear electrode regions 402A and 402B in one embodiment. Therefore, the overlay 412 is said to be aligned to the rear electrode regions 402, so that when the rear electrode region 402A is energized, the overlay region 412A is illuminated, and when the rear electrode region 402B is energized, the overlay region 412B is illuminated. The overlay 412 may be a plastic or another type of overlay, and may have graphics printed thereon, such as for marketing, advertising, and/or other purposes. Thus, the overlay 412 typically has graphics thereon that are associated with and correspond to the rear electrode regions 402A and 402B, and this is why the overlay 412 is aligned relative to the rear electrode regions 402. Alternatively, the overlay 412 may not be present, and the artwork or other graphics may be directly inkjet-printed on the transparent substrate 102, or on an ink-receptive layer that may have been applied to the transparent substrate. 102 during formation of the partial EL panel 100.

Figure 5A:
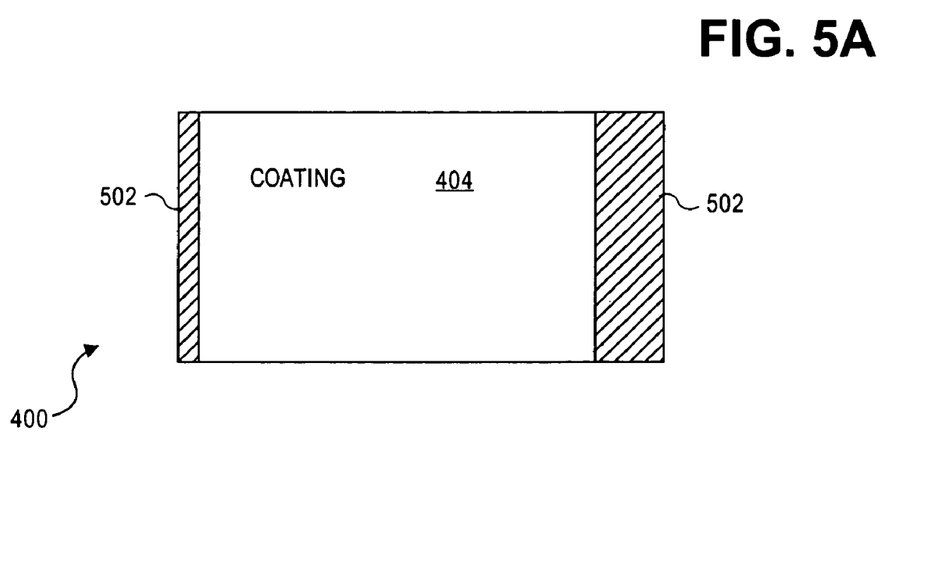
FIGS. 5A and 5B are diagrams of a complete EL panel, according to another embodiment of the invention.
Figure 5B:
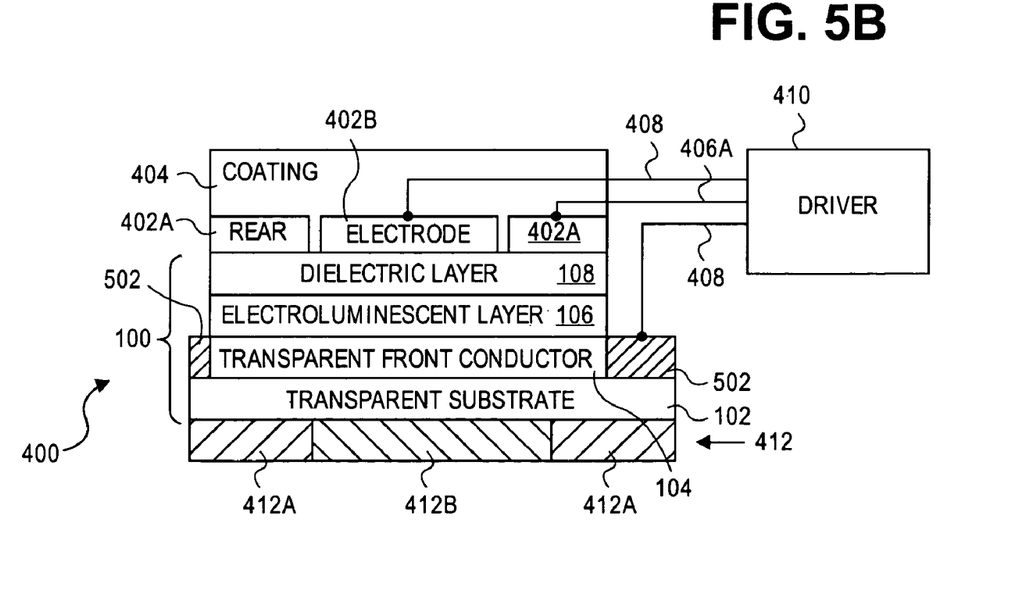

FIGS. 5A and 5B show a cross-sectional side view of the complete EL panel 400 fabricated using the partial EL panel 100, according to another embodiment of the invention. FIG. 5A specifically shows a top view of the complete EL panel 400, whereas FIG. 5B specifically shows a cross-sectional side view of the complete EL panel 400. The complete EL panel 400 of FIGS. 5A and 5B specifically employs the partial EL panel of FIGS. 3A and 3B, although the packaging layer 302 of the partial EL panel of FIGS. 3A and 3B may or may not be present. The complete EL panel 400 of FIGS. 5A and 5B is substantially similar to the complete EL panel 400 of FIGS. 4A and 4B, and is fabricated in substantially the same way, but the complete EL panel 400 of FIGS. 5A and 5B differs from the complete EL panel 400 of FIGS. 4A and 4B in two ways, as is now described.

First, before or after the rear electrode regions 402 are inkjet-printed on the dielectric layer 108 of the partial EL panel 100 using conductive ink, a front busbar 502 is also inkjet-printed on the transparent substrate 102 of the partial EL panel 100 using the same or different conductive ink or inks. As has been described in relation to FIGS. 4A and 4B, the partial EL panel 100 either includes a front busbar as a premanufactured part of the partial EL panel 100, or does not include a front busbar and no front busbar is fabricated thereon as part of the fabrication process of the complete EL panel 400. By comparison, the complete EL panel 400 of FIGS. 5A and 5B includes the front busbar 502 that is specifically inkjet-printed on the transparent substrate 102 using conductive ink. That is, the partial EL panel 100 in FIGS. 5A and 5B does not include a front busbar. Rather, the front busbar 502 is inkjet-printed on the partial EL panel 100 in FIGS. 5A and 5B, specifically on the transparent substrate 102 thereof.

Second, before the protective coating 404 is applied over the rear electrode regions 402, the electrical connects 406 are attached to the rear electrode regions 402. Thereafter, the protective coating 404 is applied over the rear electrode regions 402 as to which the electrical connects 406 have been attached. As with the protective coating 404 of FIG. 4B, the protective coating 404 may be applied over the sides of the EL panel 400 in FIG. 5B. Therefore, the creation of holes for the rear electrode regions 402 through the protective coating 404, as described in relation to FIGS. 4A and 4B, is not needed with the complete EL panel 400 of FIGS. 5A and 5B. Another electrical connect 408 is also attached to the front busbar 502 that has been inkjet-printed on the transparent substrate 102.

The two distinctions between the complete EL panel 400 of FIGS. 4A and 4B and of FIGS. 5A and 5B are independent of one another, and both do not have to be present. That is, the front busbar 502 can be inkjet-printed on the transparent substrate 102 of the partial EL panel 100 in the same complete EL panel 400 in which holes are created through the protective coating 404 to connect the electrical connects 406 to the rear electrode regions 402 after the protective coating 404 has been applied. Similarly, the electrical connects 406 can be applied to the rear electrode regions 402 before the protective coating 404 has been applied without having to also inkjet-print the front busbar 502 on the transparent substrate 102 of the partial EL panel 100.

Other than these two distinctions, the complete EL panel 400 of FIGS. 5A and 5B is and operates the same as the complete EL panel 400 of FIGS. 4A and 4B. Thus, an overlay 412 having overlay regions 412A and 412B may be aligned to the rear electrode regions 402A and 402B and applied to the transparent substrate 102. Likewise, the rear electrode regions 402 may be independently and selectively energized, via the driver 410 independently and selectively driving voltages between the electrical connects 406 and the electrical connect 408, to cause corresponding regions of the complete EL panel 400 to illuminate.

Figure 6:
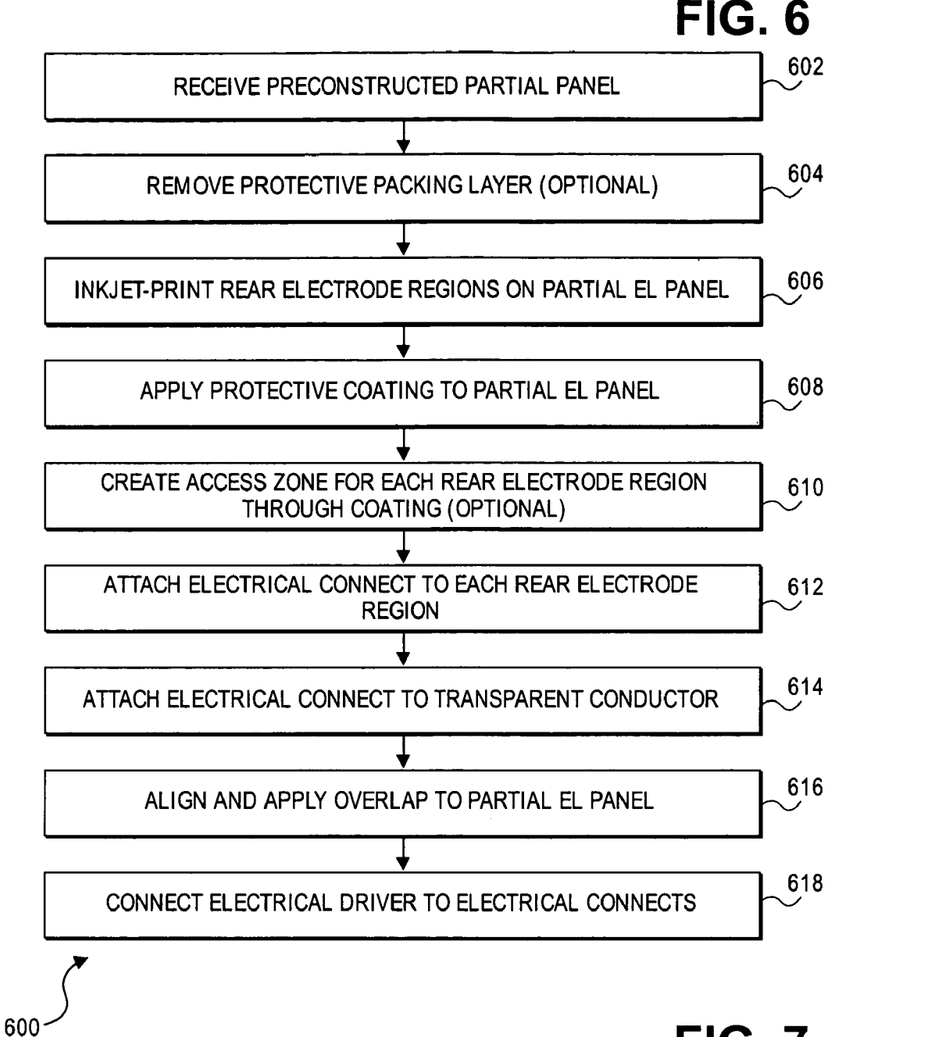
FIG. 6 is a flowchart of a method for fabricating a complete EL panel from a partial EL panel by at least inkjet-printing rear electrode regions thereon, according to an embodiment of the invention.

FIG. 6 shows a method 600 summarizing the manufacture or fabrication of a complete EL panel from a partial EL panel as has been described, according to an embodiment of the invention. A preconstructed partial EL panel is initially received (602). The partial EL panel may include a transparent substrate, a transparent front conductor, an electroluminescent layer, and a dielectric layer. The partial EL panel may further include a front busbar and/or a protective packaging layer. If the partial EL panel includes such a protective packaging layer, then it is removed (604).

One or more rear electrode regions are inkjet-printed on the partial EL panel with conductive ink (606), specifically on the dielectric layer of the partial EL panel. It is noted that prior to inkjet-printing the rear electrode regions on the partial EL panel, one or more actions may be performed relative to the dielectric layer of the partial EL panel, to make the dielectric layer more receptive to the inkjet-printing of conductive ink or inks thereon to form the rear electrode regions. Performance of such additional actions is not specifically depicted in FIG. 6. Such additional actions may include coating the dielectric with hydrophilic porous particles, such as hydrophilic silica particles in a water-soluble hydrophilic binder, such as polyvinyl acetate (PVA), or PVA latex. Such a coating may further or alternatively include metal oxides, alumina, a solvent-soluble and solvent-swellable polymer, or a solvent-wettable polymer for solvent-based conductive inks.

Typically, however, performance of such additional actions is accomplished at the time the partial EL panel is created, and not during performance of the method 600. The dielectric material may also be selected so that it is receptive to the inkjet-printing of the rear electrode regions without having to perform additional actions to the dielectric material. Furthermore, as has been described, it is noted that inkjet-printing the rear electrode regions with conductive ink encompasses performing any actions to ink that is not immediately conductive when inkjet-printed, where these actions render the ink conductive.

Optionally, a front busbar region may also be inkjet-printed on the partial EL panel with conductive ink, specifically on the transparent substrate and/or on the transparent front conductor of the partial EL panel. In one embodiment, inkjet-printing the rear electrode regions and/or the front busbar region with conductive ink is accomplished by using any readily available inkjet-printing device, such as an inkjet printer, that is receptive to ink or inkjet cartridges that encase conductive ink.

A protective coating is applied to the partial EL panel (608), specifically at least to the rear electrode regions that have been inkjet-printed on the partial EL panel. An access zone, such as a hole, may be created for each rear electrode region through the protective coating (610), such as by physically cutting such a hole within the protective coating, or by chemically removing the protective coating over a portion of each rear electrode region to create such a region. An electrical connect is then attached to each rear electrode region (612). In one embodiment, attachment of the electrical connect in 612 is accomplished prior to application of the protective coating in 608, such that creating an access zone for each rear electrode region in 610 is unnecessary. Therefore, in such an embodiment 610 is not performed.

An electrical connect is further attached to the transparent front conductor (614). Attaching an electrical connect to the transparent front conductor encompasses attaching an electrical connect either to a front busbar, where originally present on the preconstructed partial EL panel, or to a front busbar region that was inkjet-printed on the partial EL panel. Such attachment of the electrical connect to a front busbar or a front busbar region means that the electrical connect is electrically coupled to the transparent front conductor, and thus is effectively attached to the transparent front conductor, albeit indirectly. It is noted that after the electrical connects have been attached in 612 and 614, the access zones may be subsequently sealed, which is not specifically depicted in FIG. 6. Finally, an overlay is aligned to the rear electrode regions and attached to the partial EL panel (616), such as to the transparent substrate thereof, and an electrical driver is connected to all of the electrical connects (618). Alternatively, graphics may be inkjet-printed directly on the partial EL panel, such as on the transparent substrate thereof, or on an ink-receptive layer thereof.

Figure 7:
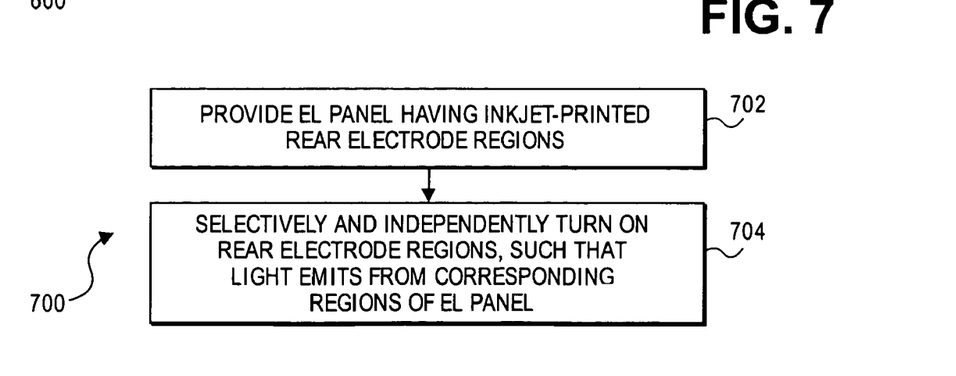
FIG. 7 is a flowchart of a method for use, according to an embodiment of the invention.

FIG. 7 shows a rudimentary method of use 700 for a complete EL panel that has been manufactured or fabricated as has been described, according to an embodiment of the invention. Such a complete EL panel is initially provided (702), where the EL panel includes rear electrode regions inkjet-printed on a preexisting partial EL panel. Thereafter, the rear electrode regions are selectively and independently turned on, or energized (704), so that light emits from corresponding regions of the complete EL panel, as has been described.

It is noted that, although specific embodiments have been illustrated and described herein, it will be appreciated by those of ordinary skill in the art that any arrangement is calculated to achieve the same purpose may be substituted for the specific embodiments shown. As just one example, whereas embodiments of the invention have been substantially described in relation to inkjet-printing rear electrode regions on a partial EL panel, other embodiments of the invention may be implemented in relation to inkjet-printing other electrode regions, such as front electrode regions. This application is thus intended to cover any adaptations or variations of the present invention. Therefore, it is manifestly intended that this invention be limited only by the claims and equivalents thereof.

I claim:

1. A method comprising:
   receiving a plurality of partial electroluminescent panels, each partial electroluminescent panel having a transparent substrate, a transparent front conductor, an electroluminescent layer, and a dielectric layer, the partial electroluminescent panels premanufactured in a large run in accordance with a process that does not employ inkjet-printing;
   for each partial electroluminescent panel of one or more partial electroluminescent panels of the plurality of partial electroluminescent panels that are lesser in number than all the plurality of partial electroluminescent panels, completely forming an electroluminescent panel using the partial electroluminescent panel in a small run smaller than the large run in which the plurality of partial electroluminescent panels were formed, where completely forming the electroluminescent panel comprises:
   inkjet-printing one or more rear electrode regions on the partial electroluminescent panel with at least one conductive ink in accordance with a desired image;
   applying a protective coating to the partial electroluminescent panel with the rear electrode regions inkjet-printed thereon; and,
   attaching a separate electrical connect for and to each rear electrode region.

2. The method of claim 1, wherein applying the protective coating to the partial electroluminescent panel comprises applying the protective coating over an entirety of the partial electroluminescent panel with the rear electrode regions inkjet-printed thereon.

3. The method of claim 1, further comprising removing a protective packaging layer from the dielectric layer before inkjet-printing the rear electrode regions, the premanufactured partial electroluminescent panel further having the protective packaging layer.

4. The method of claim 1, further comprising attaching an electrical connect to the transparent conductor.

5. The method of claim 1, wherein the electrical connect is attached to each rear electrode region prior to applying the protective coating to the partial electroluminescent panel.

6. The method of claim 1, further comprising, after applying the protective coating to the partial electroluminescent panel and before attaching the electrical connect to each rear electrode region, creating an access zone for each rear electrode region through the protective coating for attachment of the electrical connect to the rear electrode region.

7. The method of claim 6, wherein creating the access zone for each rear electrode region comprises cutting the protective coating to create the access zone.

8. The method of claim 6, wherein creating the access zone for each rear electrode region comprises chemically removing the protective coating to create the access zone.

9. The method of claim 6, wherein creating the access zone for each rear electrode region comprises drilling the protective coating to create the access zone.

10. The method of claim 6, wherein creating the access zone for each rear electrode region comprises abrading the protective coating to create the access zone.

11. The method of claim 6, wherein the access zone for each rear electrode region is subsequently sealed after an electrical connect has been attached to the rear electrode region through the access zone.

12. The method of claim 1, further comprising inkjet-printing a front busbar region with the conductive ink.

13. The method of claim 12, further comprising attaching an electrical connect to the front busbar region.

14. The method of claim 1, further comprising aligning and applying an overlay to the partial electroluminescent panel.

15. The method of claim 1, further comprising connecting an electrical driver to the electrical connect attached to each rear electrode region.

16. The method of claim 1, wherein inkjet-printing the rear electrode regions comprises curing the at least one conductive ink so that the at least one conductive ink becomes conductive, where prior to curing the at least one conductive ink is not conductive.

17. The method of claim 16, wherein curing the at least one conductive ink comprises thermally curing the at least one conductive ink.

18. The method of claim 1, wherein applying the protective coating over the entirety of the partial electroluminescent panel comprises affixing a laminate coating over the entirety of partial electroluminescent panel with an adhesive.

19. The method of claim 18, wherein affixing the laminate coating comprises affixing a fluoropolymer film.

20. The method of claim 1, wherein applying the protective coating over the entirety of the partial electroluminescent panel comprises applying a liquid protective coating over the entirety of the partial electroluminescent panel.

21. The method of claim 20, wherein applying the liquid protective coating comprises applying the liquid with one of a brusher, roller, and spray.

22. The method of claim 20, wherein applying the protective coating over the entirety of the partial electroluminescent panel further comprises curing the liquid protective coating.

23. The method of claim 20, wherein applying the protective coating over the entirety of the partial electroluminescent panel further comprises drying the liquid protective coating.

* * * * *